(12) United States Patent
Kanakarajan

(10) Patent No.: US 7,348,064 B2
(45) Date of Patent: *Mar. 25, 2008

(54) LOW TEMPERATURE POLYIMIDE ADHESIVE COMPOSITIONS AND METHODS RELATING THERETO

(75) Inventor: Kuppusamy Kanakarajan, Dublin, OH (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 91 days.

This patent is subject to a terminal disclaimer.

(21) Appl. No.: 11/282,415

(22) Filed: Nov. 18, 2005

(65) Prior Publication Data

US 2006/0068210 A1    Mar. 30, 2006

Related U.S. Application Data

(62) Division of application No. 10/305,303, filed on Nov. 26, 2002, now Pat. No. 7,026,436.

(51) Int. Cl.
*B32B 27/06* (2006.01)
*B32B 15/08* (2006.01)

(52) U.S. Cl. .................... 428/458; 428/473.5

(58) Field of Classification Search .......... 428/411.1, 428/473.5, 457–458; 528/170, 353
See application file for complete search history.

(56) References Cited

U.S. PATENT DOCUMENTS

| | | | |
|---|---|---|---|
| 3,179,630 A | 4/1965 | Endrey et al. | |
| 3,179,633 A | 4/1965 | Endrey et al. | |
| 3,179,634 A | 4/1965 | Edwards | |
| 3,410,826 A | 11/1968 | Endrey et al. | |
| 4,742,099 A | 5/1988 | Nagano et al. | |
| 4,939,039 A * | 7/1990 | Watanabe | 428/458 |
| 5,166,308 A | 11/1992 | Kreuz et al. | |
| 5,196,600 A | 3/1993 | Kreuz et al. | |
| 5,218,034 A | 6/1993 | Milligan et al. | |
| 5,227,244 A | 7/1993 | Ishikawa et al. | |
| 5,298,331 A * | 3/1994 | Kanakarajan et al. | 428/458 |
| 5,411,765 A * | 5/1995 | Kanakarajan et al. | 427/385.5 |
| 5,543,222 A | 8/1996 | Edman et al. | |
| 5,922,167 A * | 7/1999 | Rosenfeld | 156/331.5 |
| 2004/0099374 A1* | 5/2004 | Kanakarajan | 156/345.1 |
| 2005/0100719 A1* | 5/2005 | Kanakarajan et al. | 428/209 |

FOREIGN PATENT DOCUMENTS

EP    1424352    *  6/2004

* cited by examiner

*Primary Examiner*—Ana Woodward

(57) ABSTRACT

The present invention relates to a polyimide adhesive composition having a polyimide derived from an aromatic dianhydride and a diamine component, where the diamine component is preferably about 50 to 90 mole % of an aliphatic diamine and about 10 to 50 mole % of an aromatic diamine. In one embodiment, the aliphatic diamine has the structural formula $H_2N-R-NH_2$ wherein R is hydrocarbon from $C_4$ to $C_{16}$ and the polyimide adhesive has a glass transition temperature in the range of from 150° C. to 200° C.

The present invention also relates to compositions comprising the polyimide adhesive of the present invention, including polyimide metal-clad laminate useful as flexible circuit when metal traces are formed out of the metal used in flexible, rigid, or flex-rigid circuit applications.

9 Claims, No Drawings

LOW TEMPERATURE POLYIMIDE ADHESIVE COMPOSITIONS AND METHODS RELATING THERETO

This application is a division of Ser. No. 10/305,303 filed Nov. 26, 2002, now U.S. Pat. 7,026,436.

BACKGROUND OF THE INVENTION

1. Field of the Invention

The present invention relates generally to low temperature (less than about 225° C.) polyimide based adhesive compositions suitable for electronics applications, such as bonding films to form: multilayer flexible circuits, rigid-flex circuits, chip scale packaging or the like. The compositions of the present invention comprise an aliphatic-aromatic polyimide component, having advantageous thermal resistance, z-axis coefficient of thermal expansion (CTE) and modulus properties.

2. Discussion of Related Art

U.S. Pat. No. 5,922,167 to Rosenfeld is directed to polyimide adhesive compositions, having bonding temperatures taught to be in a range of about 250° C. to 450° C.

The present invention relates to prior research disclosed in U.S. Pat. No. 5,298,331, to Kanakarajan, et al. for polyimide adhesives with bonding temperatures in a range of about 250° C. to 275° C. The methods of manufacture and use described in the Kanakarajan patent are also applicable to the polyimide adhesives of the present invention, and therefore the Kanakarajan et al. patent is hereby incorporated by reference into this specification for all teachings therein.

SUMMARY OF THE INVENTION

The present invention is directed to an adhesive composition, comprising a low glass transition temperature ("Tg") polyimide base polymer. "Base polymer" as used herein is intended to mean the dominant polymer component (at least 50, 55, 60, 65, 70, 75, 80, 85, 90, 95 or 100 weight percent of all polymers present in the adhesive compositions of the present invention). Generally speaking, the (polyimide) base polymer will be at least 25, 30, 35, 40, 45, 50, 55, 60, 65, 70, 75, 80, 85, 90, 95 or 100 weight percent of the overall adhesive composition of the present invention.

The base polymer of the present invention is a polyimide synthesized by a poly-condensation reaction, involving the reaction of one or more aromatic dianhydrides with at least two types of diamines—aromatic diamine and aliphatic diamine. Substantially all of the diamine is either aliphatic or aromatic, and the mole ratio of aliphatic diamine to aromatic diamine is A:B, where A is a range of from about 50, 55, 60, or 65 to about 70, 75, 80, 85 or 90, and B is a range of from about 10, 15, 20 or 25 to about 30, 35, 40, 45 or 50.

As used herein, an "aromatic diamine" is intended to mean a diamine having at least one aromatic ring, either alone (i.e., a substituted or unsubstituted, functionalized or unfunctionalized benzene or similar-type aromatic ring) or connected to another (aromatic or aliphatic) ring, and such an amine is to be deemed aromatic, regardless of any non-aromatic moieties that might also be a component of the diamine. Hence, an aromatic diamine backbone chain segment is intended to mean at least one aromatic moiety between two adjacent imide linkages. As used herein, an "aliphatic diamine" is intended to mean any organic diamine that does not meet the definition of an aromatic diamine.

Depending upon context, "diamine" as used herein is intended to mean: (i) the unreacted form (i.e., a diamine monomer); (ii) a partially reacted form (i.e., the portion or portions of an oligomer or other polyimide precursor derived from or otherwise attributable to diamine monomer) or (iii) a fully reacted form (the portion or portions of the polyimide derived from or otherwise attributable to diamine monomer). The diamine can be functionalized with one or more moieties, depending upon the particular embodiment selected in the practice of the present invention.

Indeed, the term "diamine" is not intended to be limiting (or interpreted literally) as to the number of amine moieties in the diamine component. For example, (ii) and (iii) above include polymeric materials that may have two, one, or zero amine moieties. Alternatively, the diamine may be functionalized with additional amine moieties (in addition to the amine moieties at the ends of the monomer that react with dianhydride to propagate a polymeric chain). Such additional amine moieties could be used to crosslink the polymer or to provide other functionality to the polymer.

Similarly, the dianhydride as used herein is intended to mean the component that reacts with (is complimentary to) the diamine and in combination is capable of reacting to form an intermediate polyamic acid (which can then be cured into a polyimide). Depending upon context, "anhydride" as used herein can mean not only an anhydride moiety per se, but also a precursor to an anhydride moiety, such as: (i) a pair of carboxylic acid groups (which can be converted to anhydride by a de-watering or similar-type reaction); or (ii) an acid halide (e.g., chloride) ester functionality (or any other functionality presently known or developed in the future which is) capable of conversion to anhydride functionality.

Depending upon context, "dianhydride" can mean: (i) the unreacted form (i.e. a dianhydride monomer, whether the anhydride functionality is in a true anhydride form or a precursor anhydride form, as discussed in the prior above paragraph); (ii) a partially reacted form (i.e., the portion or portions of an oligomer or other partially reacted or precursor polyimide composition reacted from or otherwise attributable to dianhydride monomer) or (iii) a fully reacted form (the portion or portions of the polyimide derived from or otherwise attributable to dianhydride monomer).

The dianhydride can be functionalized with one or more moieties, depending upon the particular embodiment selected in the practice of the present invention. Indeed, the term "dianhydride" is not intended to be limiting (or interpreted literally) as to the number of anhydride moieties in the dianhydride component. For example, (i), (ii) and (iii) (in the paragraph above) include organic substances that may have two, one, or zero anhydride moieties, depending upon whether the anhydride is in a precursor state or a reacted state. Alternatively, the dianhydride component may be functionalized with additional anhydride type moieties (in addition to the anhydride moieties that react with diamine to provide a polyimide). Such additional anhydride moieties could be used to crosslink the polymer or to provide other functionality to the polymer.

Ordinary skill and experimentation may be necessary in preparing the polyimide compositions of the present invention, depending upon the particular monomers selected and the particular polyimide manufacturing process selected in the practice of the present invention. In one embodiment, the adhesive compositions of the present invention are polymerized to a sufficient viscosity and cured to a sufficient degree to provide the following properties:

A. z-axis dimensional stability (a z-axis coefficient of thermal expansion factor) of less than 80, 85, 90, 95, 100, 105, 110, 115, 120, 125, 130, 135, 140, 145, or 150 ppm/° C. (ASTM Method IPC-650 2.4.41),
B. a glass transition temperature from about 150, 160, 170, 180, or 185 to about 190, 195, 197 or 200° C.; and
C. a modulus from 1, 5, 10, 25, 50, 75, or 100 to about 125, 150, 175 or 200, 250, 300, 400, 500, 600, 700, 800, 900, 1000, 1200 or more kpsi.

It would be impossible to discuss or describe all possible polyimide manufacturing processes useful in the practice of the present invention. It should be appreciated that the monomer systems of the present invention are capable of providing the above-described advantageous properties in a variety of manufacturing processes. The compositions of the present invention can be manufactured as described herein and can be readily manufactured in any one of many (perhaps countless) ways of those of ordinarily skilled in the art, using any conventional or non-conventional polyimide manufacturing technology.

DESCRIPTION OF THE PREFERRED EMBODIMENTS

In one embodiment, the polyimide adhesives of the present invention are prepared by reacting a mixture of aliphatic and aromatic diamines with a mixture of aromatic dianhydrides in an organic solvent, as follows.

I. Organic Solvents

Useful organic solvents for the synthesis of the low Tg polyimides of the present invention are preferably capable of dissolving the polyimide precursor materials. Such a solvent should also have a relatively low boiling points, such as below 225° C., so the polyimide can be dried at moderate (i.e., more convenient and less costly) temperatures. A boiling point of less than 210, 205, 200, 195, 190, or 180° C. is preferred.

Solvents of the present invention may be used alone or in combination with other solvents (i.e., cosolvents). Useful organic solvents include: N-methylpyrrolidone (NMP), dimethylacetamide (DMAc), N,N'-dimethyl-formamide (DMF), dimethyl sulfoxide (DMSO), tetramethyl urea (TMU), diethyleneglycol diethyl ether, 1,2-dimethoxyethane (monoglyme), diethylene glycol dimethyl ether (diglyme), 1,2-bis-(2-methoxyethoxy) ethane (triglyme), bis [2-(2-methoxyethoxy) ethyl)] ether (tetraglyme), gamma-butyrolactone, and bis-(2-methoxyethyl) ether, tetrahydrofuran. In one embodiment, preferred solvents include N-methylpyrrolidone (NMP) and dimethylacetamide (DMAc).

Co-solvents can generally be used at about 5 to 50 weight percent of the total solvent, and useful such co-solvents include xylene, toluene, benzene, "Cellosolve" (glycol ethyl ether), and "Cellosolve acetate" (hydroxyethyl acetate glycol monoacetate).

II. Aliphatic Diamines

In one embodiment, useful aliphatic diamines have the following structural formula: $H_2N-R-NH_2$, where R is an aliphatic moiety, such as a substituted or unsubstituted hydrocarbon in a range from 4, 5, 6, 7 or 8 carbons to about 9, 10, 11, 12, 13, 14, 15, or 16 carbon atoms, and in one embodiment the aliphatic moiety is a $C_6$ to $C_8$ aliphatic.

In one embodiment, R is a $C_6$ straight chain hydrocarbon, known as hexamethylene diamine (HMD or 1,6-hexanediamine). In other embodiments, the aliphatic diamine is an alpha, omega-diamine; such diamines can be more reactive than alpha, beta-aliphatic diamines.

In one embodiment, to achieve low temperature bonding ("low temperature bonding" is intended to mean bonding in a range of from about 180, 185, or 190° C. to about 195, 200, 205, 210, 215, 220, 225, 230, 235, 240, 245 and 250° C.), the mole % of aliphatic diamine (based upon total diamine) is in a range from about 50, 55, 60, 65, or 70 to about 75, 80, 85 or 90 mole %. In this embodiment, if less than 50 mole % of the diamine component is aliphatic diamine, the resulting polyimide can sometimes have an unduly high glass transition temperature ("$T_g$") which can be detrimental to low temperature bonding. In one embodiment, if more than 90 mole % of the diamine component is an aliphatic diamine, then any resulting polyimide film can become too brittle for some flexible material applications.

In one embodiment, as the aliphatic diamine to aromatic diamine ratio increases, the glass transition temperature (Tg) of the polyimide, and lamination temperature will generally tend to decrease. In one embodiment, for bonding to metal to properly occur, the lamination temperature is typically about 25° C. higher than the glass transition temperature of the polyimide adhesive. For example, if the glass transition temperature of the polyimide is in the range of about 150° C. to 200° C., then the optimal bonding temperature will be in the range of about 180° C. to 250° C.

In one embodiment, the aliphatic diamine is 75±10, 8, 6, 4, 2 or 1 mole % hexamethylene diamine (HMD) and the aromatic diamine is 25±10, 8, 6, 4, 2 or 1 mole %, 1,3-bis-(4-aminophenoxy) benzene (APB-134, RODA). Here, the glass transition temperature of the polyimide adhesive is in a range of about 175±10° C. At a lamination temperature (bonding temperature) of about 200±10, 8, 6, 4, 2 or 1° C., the polyimide adhesive can be a viable substitute for an acrylic or epoxy coverlay composition, compositions commonly used as conformal coatings and encapsulates in electronics applications.

Depending upon the particular embodiment of the present invention, other suitable aliphatic diamines include, 1,4-tetramethylenediamine, 1,5-pentamethylenediamine (PMD), 1,7-heptamethylene diamine, 1,8-octamethylenediamine, 1,9-nonamethylenediamine, 1,10-decamethylenediamine (DMD), 1,11-undecamethylenediamine, 1,12-dodecamethylenediamine (DDD), 1,16-hexadecamethylenediamine. The preferred aliphatic diamine is hexamethylene diamine (HMD).

III. Aromatic Diamines

In one embodiment, from about 5, 10, 15, 20, or 25 mole % to about 30, 35, 40, 45, and above, but less than 50 mole % of the diamine component of the polyimide adhesives of the present invention are aromatic diamines. Other suitable aromatic diamines include, m-phenylenediamine, p-phenylenediamine, 2,5-dimethyl-1,4-diaminobenzene, trifluoromethyl-2,4-diaminobenzene, trifluoromethyl-3,5-diaminobenzene, 2,5-dimethyl-1,4-phenylenediamine (DPX), 2,2-bis-(4-aminophenyl) propane, 4,4'-diaminobiphenyl, 4,4'-diaminobenzophen 4,4'-diaminodiphenylmethane, 4,4'-diaminodiphenyl sulfide, 4,4'-diaminodiphenyl sulfone, 3,3'-diaminodiphenyl sulfone, bis-(4-(4-aminophenoxy) phenyl sulfone (BAPS), 4,4'-bis-(aminophenoxy)biphenyl (BAPB), 4,4'-diaminodiphenyl ether, 3,4'-diaminodiphenyl ether, 4,4'-diaminobenzophenone, 4,4'-isopropylidenedianiline, 2,2'-bis-(3-aminophenyl) propane, N,N-bis-(4-aminophenyl)-n-butylamine, N,N-bis-(4-aminophenyl) methylamine, 1,5-diaminonaphthalene, 3,3'-dimethyl-4,4'-diaminobiphenyl, m-amino benzoyl-p-amino anilide, 4-aminophenyl-3-aminobenzoate, N,N-bis-(4-aminophenyl) aniline, 2,4-diaminotoluene, 2,5-diaminotoluene, 2,6-diaminotoluene, 2,4- diamine-5-chlorotoluene, 2,4-diamine-6-chlorotoluene, 2,4-bis-(beta-amino-t-butyl) toluene, bis-(p-beta-amino-t-butyl phenyl) ether, p-bis-2-(2-methyl-4-aminopentyl) benzene, m-xylylene diamine, and p-xylylene diamine.

Other useful aromatic diamines include, 1,2-bis-(4-aminophenoxy) benzene, 1,3-bis-(4-aminophenoxy) benzene, 1,2-bis-(3-aminophenoxy) benzene, 1,3-bis-(3-aminophenoxy) benzene, 1-(4-aminophenoxy)-3-(3-aminophenoxy) benzene, 1,4-bis-(4-aminophenoxy) benzene, 1,4-bis-(3-aminophenoxy) benzene, 1-(4-aminophenoxy)-4-(3-aminophenoxy) benzene, 2,2-bis-(4-[4-aminophenoxy] phenyl) propane (BAPP), 2,2'-bis-(4-aminophenyl)-hexafluoro propane (6F diamine), 2,2'-bis-(4-phenoxy aniline) isopropylidene, 2,4,6-trimethyl-1,3-diaminobenzene, 4,4'-diamino-2,2'-trifluoromethyl diphenyloxide, 3,3'-diamino-5,5'-trifluoromethyl diphenyloxide, 4,4'-trifluoromethyl-2,2'-diaminobiphenyl, 2,4,6-trimethyl-1,3-diaminobenzene, 4,4'-oxy-bis-[2-trifluoromethyl) benzene amine] (1,2,4-OBABTF), 4,4'-oxy-bis-[3-trifluoromethyl) benzene amine], 4,4'-thio-bis-[(2-trifluoromethyl)benzene-amine], 4,4'-thiobis[(3-trifluoromethyl)benzene amine], 4,4'-sulfoxyl-bis-[(2-trifloromethyl) benzene amine, 4,4'-sulfoxy]-bis-[(3-trifluoromethyl) benzene amine], and 4,4'-keto-bis-[(2-trifluoromethyl) benzene amine].

In one embodiment, the preferred aromatic diamines are the isomers of bis-aminophenoxybenzenes (APB), aminophenoxyphenylpropane (BAPP), dimethylphenylenediamine (DPX), bisaniline P, and combinations thereof. In certain embodiments, the use of these particular diamines can lower the lamination temperature of the adhesive, and will increase the peel strength of the adhesive to other materials, especially metals.

IV. Aromatic Dianhydrides

In this embodiment, any aromatic dianhydride or combination of aromatic dianhydrides, can be used as the dianhydride monomer in forming the polyimide. These dianhydrides may be used alone or in combination with one another. The dianhydrides can be used in their tetra-acid form (or as mono, di, tri, or tetra esters of the tetra acid), or as their diester acid halides (chlorides). However in some embodiments, the dianhydride form can be preferred, because it is generally more reactive than the acid or the ester.

Examples of suitable aromatic dianhydrides include, 1,2,5,6-naphthalene tetracarboxylic dianhydride, 1,4,5,8-naphthalene tetracarboxylic dianhydride, 2,3,6,7-naphthalene tetracarboxylic dianhydride, 2-(3',4'-dicarboxyphenyl) 5,6-dicarboxybenzimidazole dianhydride, 2-(3',4'-dicarboxyphenyl) 5,6-dicarboxybenzoxazole dianhydride, 2-(3',4'-dicarboxyphenyl) 5,6-dicarboxybenzothiazole dianhydride, 2,2',3,3'-benzophenone tetracarboxylic dianhydride, 2,3,3',4'-benzophenone tetracarboxylic dianhydride, 3,3',4,4'-benzophenone tetracarboxylic dianhydride (BTDA), 2,2',3,3'-biphenyl tetracarboxylic dianhydride, 2,3,3',4'-biphenyl tetracarboxylic dianhydride, 3,3',4,4'-biphenyl tetracarboxylic dianhydride (BPDA), bicyclo-[2,2,2]-octen-(7)-2,3,5,6-tetracarboxylic-2,3,5,6-dianhydride, 4,4'-thio-diphthalic anhydride, bis (3,4-dicarboxyphenyl) sulfone dianhydride, bis (3,4-dicarboxyphenyl) sulfoxide dianhydride (DSDA), bis (3,4-dicarboxyphenyl oxadiazole-1,3,4) p-phenylene dianhydride, bis (3,4-dicarboxyphenyl) 2,5-oxadiazole 1,3,4-dianhydride, bis 2,5-(3',4'-dicarboxydiphenylether) 1,3,4-oxadiazole dianhydride, 4,4'-oxydiphthalic anhydride (ODPA), bis (3,4-dicarboxyphenyl) thio ether dianhydride, bisphenol A dianhydride (BPADA), bisphenol S dianhydride, 2,2-bis-(3,4-dicarboxyphenyl) 1,1,1,3,3,3,-hexafluoropropane dianhydride (6FDA), 5,5-[2,2,2]-trifluoro-1-(trifluoromethyl) ethylidene, bis-1,3-isobenzofurandione, 1,4-bis(4,4'-oxyphthalic anhydride) benzene, bis (3,4-dicarboxyphenyl) methane dianhydride, cyclopentadienyl tetracarboxylic acid dianhydride, cyclopentane tetracarboxylic dianhydride, ethylene tetracarboxylic acid dianhydride, perylene 3,4,9,10-tetracarboxylic dianhydride, pyromellitic dianhydride (PMDA), tetrahydrofuran tetracarboxylic dianhydride, 1,3-bis-(4,4'-oxydiphthalic anhydride) benzene, 2,2-bis(3,4-dicarboxyphenyl) propane dianhydride, 2,6-dichloronaphthalene-1,4,5,8-tetracarboxylic dianhydride, 2,7-dichloronaphthalene-1,4,5,8-tetracarboxylic dianhydride, 2,3,6,7-tetrachloronaphthalene-1,4,5,8-tetracarboxylic dianhydride, phenanthrene-1,8,9,10-tetracarboxylic dianhydride, pyrazine-2,3,5,6-tetracarboxylic dianhydride, benzene-1,2,3,4-tetracarboxylic dianhydride; and thiophene-2,3,4,5-tetracarboxylic dianhydride.

In this embodiment, the preferred dianhydrides are BTDA and BPDA as they are readily available and have been found to provide excellent properties.

V. Preparation of the Polyimide Adhesives

A polyimide film according to the present invention can be produced by combining the diamine and dianhydride (monomer or other polyimide precursor form) together with a solvent to form a polyamic acid (also called a polyamide acid) solution. The dianhydride and diamine can be combined in a molar ratio of about 0.90 to 1.10. Molecular weight of the polyamic acid formed therefrom can be adjusted by adjusting the molar ratio of the dianhydride and diamine.

In one embodiment, a polyamic acid casting solution is derived from the polyamic acid solution. The polyamic acid casting solution preferably comprises the polyamic acid solution combined with conversion chemicals like: (i.) one or more dehydrating agents, such as, aliphatic acid anhydrides (acetic anhydride, etc.) and/or aromatic acid anhydrides; and (ii.) one or more catalysts, such as, aliphatic tertiary amines (triethyl amine, etc.), aromatic tertiary amines (dimethyl aniline, etc.) and heterocyclic tertiary amines (pyridine, picoline, isoquinoline, etc.). The anhydride dehydrating material it is often used in molar excess compared to the amount of amide acid groups in the polyamic acid. The amount of acetic anhydride used is typically about 2.0-3.0 moles per equivalent of polyamic acid. Generally, a comparable amount of tertiary amine catalyst is used.

In one embodiment, the polyamic acid solution, and/or the polyamic acid casting solution, is dissolved in an organic solvent at a concentration from about 5.0 or 10% to about 15, 20, 25, 30, 35 and 40% by weight.

The polyamic acid (and casting solution) can further comprise any one of a number of additives, such as processing aids (e.g., oligomers), antioxidants, light stabilizers, flame retardant additives, anti-static agents, heat stabilizers, ultraviolet absorbing agents, inorganic fillers or various reinforcing agents. These inorganic fillers include thermally conductive fillers, like metal oxides, and electrically conductive fillers like metals and electrically conductive polymers. Common inorganic fillers are alumina, silica, silicon carbide, diamond, clay, boron nitride, aluminum nitride, titanium dioxide, dicalcium phosphate, and fumed metal oxides. Common organic fillers include polyaniline, polythiophene, polypyrrole, polyphenylenevinylene, polydialkylfluorenes, carbon black, and graphite.

The solvated mixture (the polyamic acid casting solution) can then be cast or applied onto a support, such as an endless belt or rotating drum, to give a film. Next, the solvent containing-film can be converted into a self-supporting film by baking at an appropriate temperature (thermal curing) together with conversion chemical reactants (chemical curing). The film can then be separated from the support, oriented such as by tentering, with continued thermal and chemical curing to provide a polyimide film.

Useful methods for producing polyimide film in accordance with the present invention can be found in U.S. Pat. No. 5,166,308 and U.S. Pat. No. 5,298,331 are incorporate by reference into this specification for all teachings therein. Numerous variations are also possible, such as, (a) A method wherein the diamine components and dianhydride components are preliminarily mixed together and then the mixture is added in portions to a solvent while stirring.

(b) A method wherein a solvent is added to a stirring mixture of diamine and dianhydride components. (contrary to (a) above)

(c) A method wherein diamines are exclusively dissolved in a solvent and then dianhydrides are added thereto at such a ratio as allowing to control the reaction rate.

(d) A method wherein the dianhydride components are exclusively dissolved in a solvent and then amine components are added thereto at such a ratio to allow control of the reaction rate.

(e) A method wherein the diamine components and the dianhydride components are separately dissolved in solvents and then these solutions are mixed in a reactor.

(f) A method wherein the polyamic acid with excessive amine component and another polyamic acid with excessive dianhydride component are preliminarily formed and then reacted with each other in a reactor, particularly in such a way as to create a non-random or block copolymer.

(g) A method wherein a specific portion of the amine components and the dianhydride components are first reacted and then the residual diamine components are reacted, or vice versa.

(h) A method wherein the conversion chemicals are mixed with the polyamic acid to form a polyamic acid casting solution and then cast to form a gel film.

(i.) A method wherein the components are added in part or in whole in any order to either part or whole of the solvent, also where part or all of any component can be added as a solution in part or all of the solvent.

(j) A method of first reacting one of the dianhydride components with one of the diamine components giving a first polyamic acid. Then reacting the other dianhydride component with the other amine component to give a second polyamic acid. Then combining the amic acids in any one of a number of ways prior to film formation.

The thickness of the polyimide film may be adjusted depending on the intended purpose of the film or final application specifications. It is generally preferred that the thickness of the film ranges from 2, 3, 5, 7, 8, 10, 12, 15, 20, or 25 microns to about 25, 30, 35, 40, 45, 50, 60, 80, 100, 125, 150, 175, 200, 300, 400 or 500 microns. Preferably, the thickness is from about 8 to about 125 microns, more preferably from 12 to 25 microns.

Polyimide films according to the present invention can be used as a base film adhesive for a laminate for incorporation into a flexible printed circuit board ("FPC"). In one embodiment, a flexible printed circuit board ("FPC") can be produced as follows:

1. laminating a copper or other conductive foil (or conductive layer) to the adhesive polyimide;

2. forming a circuit pattern (broadly speaking: application of a resist, photo-patterning and development of the resist, copper etching and removal of the resist).

In one embodiment, the films of the present invention are used as a coverlay film. Coverlay films are laminated to etched circuitry traces (metal traces) of a flexible printed circuit board. The adhesive polyimide encapsulates the copper circuitry, protecting it from the environment and providing electrical and thermal insulation. The flexible printed circuit board, covered with the films of the present invention, may be single sided, double sided, or be incorporated into a stack of several individual flexible printed circuits to form what is commonly referred to as a multilayer board. Any of these types of circuits may be used in a solely flexible printed circuit or may be combined with rigid circuitry applications to form a rigid/flex or flex/rigid printed wiring board.

The polyimide films of the present invention may have other polyimides bonded to them. Examples of such polyimides are higher $T_g$ polyimides used as a base layer in a two or three-layer, co-extruded product. In such a co-extruded product, the polyimide adhesives of the present invention are simultaneously solution cast with high-modulus polyimides. At the time of casting, the polyimides are in the form of a polyamic acid solution. The cast solutions form an uncured polyamic acid film that is later cured to a polyimide. In one embodiment, the polyimide adhesives are cast with a single layer of higher $T_g$ polyimide.

In another embodiment, the polyimide adhesives of the present invention are cast on two sides of a higher $T_g$ polyimide. In yet another embodiment, the polyimides of the present invention are cast alone to form a sheet adhesive material useful as a center layer in a metal laminate structure, or as a coverlay material for a printed circuit board.

The adhesion strength of the above-described laminates can be improved by employing various techniques for elevating adhesion strength. For example, prior to the step of applying the adhesives of the present invention onto a metal foil, or the exposed circuitry in a coverlay application, the polyimide can be subjected to a pre-treatment step. These pre-treatment steps include, heat treatment, corona treatment, plasma treatment under atmospheric pressure, plasma treatment under reduced pressure, treatment with coupling agents like silanes and titanates, sandblasting, alkali-treatment, acid-treatments, and coating polyamic acids. To improve the adhesion strength, it is generally also possible to add various metal compounds as disclosed in U.S. Pat. Nos. 4,742,099; 5,227,244; 5,218,034; and 5,543,222 incorporated herein by reference.

In addition, to improve adhesion between the adhesives of the present invention and metal foil, or exposed circuitry in a coverlay application, the metal surface may be treated with various organic and inorganic treatments. These treatments include using silanes, imidazoles, triazoles, oxide and reduced oxide treatments, tin oxide treatment, and surface cleaning/roughening (called micro-etching) via acid or alkaline reagents.

The polyimide adhesives of the present invention can also be applied to fully cured polyimide base films or can be applied to one of the intermediate manufacturing stages of polyimide film such as to "gel" film or to "green" film.

The term "gel" film refers to a polyamic acid sheet, which is laden with volatiles, primarily solvent, to such an extent that the polyamic acid is in a gel-swollen, or rubbery condition. The volatile content is usually in the range of 70 to 90% by weight and the polymer content usually in the range of 10 to 30% by weight of the gel film. The final film becomes "self-supporting" in the gel film stage. It can be stripped from the support on which it was cast and heated to a final curing temperature. The gel film generally has an amic acid to imide ratio between 10:90 and 50:50, most often 30:70.

The gel film structure can be prepared by the method described in U.S. Pat. No. 3,410,826. This prior art discloses mixing a chemical converting agent and a catalyst such as a lower fatty acid anhydride and a tertiary amine, into the polyamic-acid solution at a low temperature. This is followed by casting the polyamic-acid solution in film-form, onto a casting drum. The film is mildly heated after casting, at for example 100° C., to activate the conversion agent and catalyst in order to transform the cast film to a polyamic acid/polyimide gel film.

Another type of polyimide base film, is a "green film" which is partially polyamic acid and partially polyimide. Green film contains generally about 50 to 75% by weight polymer and 25 to 50% by weight solvent. It is sufficiently strong to be self-supporting. Green film can be prepared by casting the polyamic acid solution into film form onto a suitable support such as a casting drum or belt and removing the solvent by mild heating at up to 150° C. A low proportion of amic acid units in the polymer, e.g., up to 25%, may be converted to imide units.

Application of the adhesives of the present invention can be accomplished in any number of ways. Such methods include using a slot die, dip coating, or kiss-roll coating a film followed by metering with doctor knife, doctor rolls, squeeze rolls, or an air knife. The coating may also be applied by brushing or spraying. By using such techniques, it is possible to prepare both one and two-sided coated laminates. In preparation of the two-side coated structures, one can apply the coatings to the two sides of a polyimide either simultaneously or consecutively before going to the curing and drying stage of the polyimide.

In a further embodiment, the polyamic acid adhesive may be coated on a fully cured polyimide base film or directly on a metal substrate and subsequently imidized by heat treatment. The polyimide base film may be prepared by either a chemical or thermal conversion process and may be surface treated, e.g. by chemical etching, corona treatment, laser etching etc., to improve adhesion.

A single polyimide metal-clad of the present invention comprises a flexible polyimide layer which adheres to a metal foil such as copper, aluminum, nickel, steel or an alloy containing one or more of these metals. The polyimide layer adheres firmly to the metal and has a peel strength of 2 pounds per linear inch and higher. The metal may be adhered to one or both sides of the polyimide layer.

The polyimide adhesive films of the present invention will bond to copper at from about 2 pounds per linear inch to about 15 pounds per linear inch. The bonding temperature is typically between 180° C. and 250° C. In one embodiment, a polyimide adhesive of the present invention bonded to copper with a bonding strength of about 8 pounds per linear inch, a bonding temperature of 200° C., and a glass transition temperature of about 165 to 185° C.

As used herein, the term "conductive layers" and "conductive foils" are meant to be metal layers or metal foils. Conductive foils are typically metal foils. Metal foils do not have to be used as elements in pure form; they may also be used as metal foil alloys, such as copper alloys containing nickel, chromium, iron, and other metals. The conductive layers may also be alloys of metals and are typically applied to the polyimides of the present invention via a sputtering step followed by an electroplating step. In these types of processes, a metal seed coat layer is first sputtered onto the polyimide adhesive. Finally, a thicker coating of metal is applied to the seed coat via electro-plating or electro-deposition. Such sputtered metal layers may also be hot pressed above the glass transition temperature of the polymer for enhanced peel strength.

Conductive foils are also useful. Particularly suitable metallic substrates are foils of rolled, annealed copper or rolled, annealed copper alloy. In many cases, it has proved to be of advantage to pre-treating the metallic substrate before coating. This pretreatment may include, but is not limited to, electro-deposition or immersion-deposition on the metal of a thin layer of copper, zinc, chrome, tin, nickel, cobalt, other metals, and alloys of these metals. The pretreatment may consist of a chemical treatment or a mechanical roughening treatment. It has been found that this pretreatment enables the adhesion of the polyimide layer and, hence, the peel strength to be further increased. Apart from roughening the surface, the chemical pretreatment may also lead to the formation of metal oxide groups, enabling the adhesion of the metal to the polyimide layer to be further increased. This pretreatment may be applied to both sides of the metal, enabling enhanced adhesion to substrates on both sides.

A polyimide multi-clad of the present invention comprising a double side copper clad can be prepared by laminating copper foil to both sides of an adhesive coated dielectric polyimide film. The construction can also be made by laminating adhesive coated copper foil to both sides of a dielectric polyimide film or to an adhesive coated dielectric polyimide film.

The polyimides of the present invention provide many attributes not common to materials that bond in the temperature range of from about 180° C. to 250° C. Firstly, the polyimide adhesives of the present invention provide superior thermal resistance and z-axis dimensional stability. In thin film or laminate construction, dimensional stability is measured in ppm/° C. and is typically referred to with respect to the x-y plane. However, in modern circuitry applications z-directional dimensional stability (through the film thickness), especially in films where the dielectric is less than 25 microns, is increasingly important. The films of the present invention are superior in z-axis dimensional stability (z-axis coefficient of thermal expansion) by providing a expansion factor of less than 120 ppm/° C., typically 90 ppm/° C., whereas most acrylics are about 300 to 400 ppm/° C. The coefficient of thermal expansion is measured by ASTM Method IPC-650 2.4.41 and is included herein by reference.

In addition to providing superior z-axis dimensional stability (coefficient of thermal expansion) the polyimide adhesive films of the present invention have a low loss-tangent value. Loss-tangent is typically measured at 10 GHz and is used to measure a dielectric material's degradation of a nearby digital signal that is passing through a metal circuit trace. Different loss-tangent values exist for different dielectric materials. The lower the loss-tangent value for a given dielectric material, the more superior a material is for digital circuitry applications. The polyimide adhesives of the present invention exhibit superior, low loss-tangent values. In one embodiment, the loss-tangent value for the polyimide adhesive was less than 0.010, about 0.004, at 10 GHz. The polyimides of present invention may also be used in applications ranging from 1 to 100 GHz, with 1 to 20 GHz being most common. For acrylic and epoxy dielectric materials, poor loss-tangents values of about 0.025 at 10 GHz are typically observed.

In another embodiment, the polyimides of the present invention are used as a material used to construct a planar transformer component. These planar transformer components are commonly used in power supply devices. In yet another embodiment, the polyimide adhesives of the present invention may be used with thick metal foils (like Inconel) to form flexible heaters. These heaters are typically used in automotive and aerospace applications.

The polyimide films of the present invention exhibit superior attenuation when compared to the acrylics and epoxies of the prior art. The polyimide adhesives of the present invention exhibit an attenuation value, measured in decibels per inch, of about 0.3 at 10 GHz using a 50-ohm micro strip. Acrylic materials under the same test exhibit an attenuation value of about 0.9. As such, the polyimide adhesives of the present invention are superior over acrylics and epoxies due to their superior z-axis dimensional stability, low loss-tangent, and low attenuation.

In one embodiment of the present invention, the polyimide adhesives are used in combination with higher Tg polyimides to form polyimide metal-clad laminates. As used herein, higher Tg polyimides are polyimides that are widely considered as thermosetting polyimides, commonly referred to as "thermoset" polyimides. These polyimides are derived from dianhydrides such as PMDA, BPDA, BTDA and the like, and diamines such as p-phenylene diamine, m-phenylene diamine, 3,4'-oxydianiline, 4,4'-oxydianiline, and biphenyldiamine. The higher $T_g$ polyimides films mentioned above are preferably about 0.3 to 5.0 mils in thickness. These higher Tg polyimides can be obtained from polyamic acid precursors derived from the reaction of suitable diamines with suitable dianhydrides in the manner described in, for example, U.S. Pat. Nos. 3,179,630, 3,179,633, 3,179,634, 5,166,308, and 5,196,500 incorporated herein by reference.

In one embodiment, the adhesive polyimides of the present invention and the higher Tg polyimides mentioned above, are cast in their polyamic acids precursor forms using a multi-port die to form either two layer and three layer polyimides. These multi-layer polyimides are then bonded to metal using the polyimide adhesive as the bonding medium to the metal. Thus, the polyimide film metal-clad laminates formed comprise at least one layer of a polyimide base film (the high modulus layer) and at least one layer of polyimide adhesive film (the films herein of the present invention).

Bonding of the multi-layer polyimide to the metal usually takes place in a double belt press in roll to roll processing, or in an autoclave in sheet to sheet processing. Alternatively, the polyimide adhesives of the present invention may be directly bonded to one or both sides of a metal substrate to form a polyimide metal-clad laminate. Yet, another method of forming a polyimide film metal-clad laminate is to coat an already formed higher $T_g$ and/or high modulus polyimide with the polyimide adhesives of the present invention and then bonded the multi-layer polyimide to a metal. Finally, yet another way to form the polyimide metal-clad laminate is to sputter a metal seed coat and then electro-plate a thicker metal layer onto an existing polyimide adhesive layer, or polyimide multi-layer.

Thus, a polyimide multi-clad of the present invention comprises at least one layer metal and one layer of the polyimide adhesives of the present invention. In some cases, a higher Tg and/or high modulus polyimide is also incorporated and in other cases two layers of metal, and two layers of polyimide adhesive may be employed.

The polyimide films of the present invention can be used as an adhesive film, optionally with a higher $T_g$ polyimide film. Higher $T_g$ polyimide films for purposes of this invention are meant to be polyimide films that either have no measurable glass transition temperature, or have a glass transition temperature greater than 250° C. These polyimides are used for insulating electronic parts, electronic circuit boards, and electronic equipment.

The films of the present invention, when used with higher $T_g$ polyimide films, are particularly useful for die pad bonding of flexible print connection boards or semiconductor devices or packaging materials for CSP (chip scale package), chip on flex (COF), COL (chip on lead), LOC (lead on chip), multi-chip module ("MCM"), ball grid array ("BGA" or micro-ball grid array), and/or tape automated bonding ("TAB").

In one embodiment, the present invention includes a method for bonding an integrated circuit chip to a lead frame. The method includes first preparing a solution in an organic solvent of a polyamic acid comprising the reaction product of components comprising an aromatic dianhydride and a diamine. The diamine consists essentially of a mixture of about 50 to about 90 mole % of an aliphatic diamine and about 10 to about 50 mole % of an aromatic diamine. Next, the polyamic acid is applied to either the integrated circuit chip or the lead frame. Under heat, the organic solvent is removed and the polyamic acid is converted via imidization to a polyimide. Then, under pressure and heat, the integrated circuit chip and lead frame are bonded together.

In another embodiment, the polyimide adhesive films of the present invention are used for wafer level integrated circuit packaging, where a composite is made comprising a substrate according to the present invention interposed between a conductive layer (typically a metal) having a thickness of less than 100 microns, and a wafer comprising a plurality of integrated circuit dies. Here, the adhesives of the present invention are used as the adhesive layer that bonds the conductive layer to high modulus, polyimide substrates. In one (wafer level integrated circuit packaging) embodiment, the conductive passageway is connected to the dies by a conductive passageway, such as a wire bond, a conductive metal, a solder bump or the like.

The advantageous properties of this invention can be observed by reference to the following examples that illustrate, but do not limit, the invention. All parts and percentages are by weight unless other wise indicated.

EXAMPLES

Polyamic acid solutions were prepared reacting the appropriate molar equivalents of the monomers in dimethylacetamide (DMAc) solvent. Typically, the diamine dissolved in DMAc was stirred under nitrogen, and the dianhydride was added as a solid over a period of several minutes. Stirring was continued to obtain maximum viscosity of the polyamic acid. The viscosity was adjusted by controlling the amount of dianhydride in the polyamic acid composition.

The polyamic acids were coated on a fully cured corona treated polyimide base film derived from pyromellitic dianhydride and 4,4'-diaminodiphenyl ether. The polyamic acids were converted to polyimide either by a thermal conversion process or by a chemical conversion process using acetic anhydride as a dehydrating agent and beta-picoline as a catalyst.

The polyamic acids were coated on the base polyimide film using a coating bar to a thickness of 0.5 mils and the solvent removed by heating, although coating thicknesses of from about 5, 7.5, 10, 12.5, 15, 17.5, 20, 22.5 or 25 to about 30, 35, 40, 45, 50, 60, 70, 80 or more microns can be appropriate, depending upon the particular embodiment. The coated polyimide films were placed on a pin frame and cured.

The coated polyimide films were subsequently laminated to roll-annealed copper at temperatures of 180° C. to 250° C. to form a polyimide-metal clad.

Roll clad laminates could also be made by continuous lamination of the adhesive coated dielectric film to copper foil using a high temperature double belt press or a high temperature nip roll laminator. Peel strength results, of the polyimide copper-clad laminates, were determined by ASTM method IPC-TM-650, Method No. 2.4.9D.

Examples 1-9

1,3-bis-(4-aminophenoxy)benzene (APB-134) and 1,6-hexanediamine (HMD) were dissolved in dry dimethylacetamide (DMAc) solvent using a 1-liter beaker. The beaker was placed in a dry box. The mixture was stirred well and the temperature raised to 50° C.

A mixture of biphenyltetracarboxylic dianhydride (BPDA) and benzophenone tetracarboxylic dianhydride (BTDA) was prepared as the dianhydride mixture. Ninety-five percent by weight of the dianhydride mixture was added slowly to the diamine, over a period of 10 minutes.

The exothermic reaction was allowed to rise to 80° C. to ensure complete reaction of the diamines and dianhydrides to form a polyamic acid solution. The viscosity of the polyamic acid was adjusted, by adding a portion of the remaining dianhydride, to a desirable value anywhere from 50 poise to 1000 poise. The polyamic acid solution was stirred for an additional 1 hour at 35° C.

A small portion of the polyamic acid solution was cast on a glass plate. The casting was dried on a hot plate at 80° C. for 30 minutes. A two mil (two thousands of an inch) thick film was produced.

The film was peeled from the glass plate and placed on a steel pin frame. Then the film was dried (and partially cured) in a high temperature oven. The starting temperature was 80° C., and temperature was increased to 250° C. at a rate of 5° C./min. The film was removed from the oven and cured for an additional 5.0 minutes in an oven set at 330° C.

A copper laminate was made by placing the cured film against the treated side of a 1 oz RA copper foil. Bonding took place at 180° C. to 250° C., at 350-psi pressure, using vacuum lamination process. The polyimide-metal laminate was tested for adhesion strength using an Instron tester per ASTM Method IPC-TM-650, Method No. 2.4.9.D. These results are giving in the Tables 1 and 2 below. The peel numbers were generally high at greater than 200° C. lamination, in the range of about 2 pounds per linear inch (pli), commonly 8 pounds per linear inch.

The film was also used as coverlay and bond-ply. Coverlay compositions are used to protect the delicate circuit traces (fragile metal circuit patterns) that would otherwise be exposed on the surface of the flexible circuit or that would otherwise be susceptible to damage. Coverlay compositions are placed over the circuit traces as a sheet, and then vacuum-pressed and/or roll-pressed, so that the coverlay is bonded directly to the circuit traces. Good encapsulation of the copper conductor lines (circuit traces) occurred at 200° C. and 350 psi pressure. A bond-ply is a layer of material used to bond a second layer of polyimide to either a copper layer or a rigid board assembly. Typically, a bond-ply material (like the adhesive polyimide of the present invention) is used on either side of another polyimide to encase that polyimide within the adhesive structure of the outer two layers. As such, a second polyimide is encased within two polyimide adhesive layers where the inner layer is used as a highly dimensionally stable material, a thermal conductive polyimide, a high modulus polyimide, or simply a lower cost polyimide. The coverlay laminates and bond-ply constructions formed herein are suitable for manufacture of a high count, multi-layer, or rigid/flex printed wiring board assemblies.

TABLE 1

| EX. NO. | ADHESIVE COMPOSITION (MOLE %) | LAMINATION TEMP 180 C. PEEL STRENGTH | LAMINATION TEMP 190 C. PEEL STRENGTH | LAMINATION TEMP 200 C. PEEL STRENGTH | LAMINATION TEMP 250 C. PEEL STRENGTH | CURING | Tg |
|---|---|---|---|---|---|---|---|
| EX-1 | BPDA/BTDA/RODA/HMD 90%/10%/35%/65% | NO ADHESION | 2.7 PLI | 6 PLI | 8.5 PLI | 70 C.-150 1 HR 150-250 C. 1 HR. 320 C. 5 MIN. | 181.8 |
| EX-2 | BPDA/BTDA/RODA/HMD 90%/10%/30%/70% | 1.2 PLI | 6 PLI | 7.4 PLI | 9 PLI | SAME | 178.2 |
| EX-3 | BPDA/BTDA/RODA/HMD 90%/10%/20%/80% | 1.5 PLI | 4.5 PLI | 6.8 PLI | 6.5 PLI | 70-150 C. 1 HR 150-250 C. 1 HR 300 C. 5 MIN. | 164.7 |
| EX-4 | BPDA/BTDA/RODA/HMD 90%/10%/25%/75% | 1.8 PLI | 6.5 PLI | 8 PLI | 8 PLI | 70-150-1 HR 150-250 C. 1 HR 320 C. 5 MIN. | 175.2 |
| EX-5 | BPDA/BTDA/RODA/HMD 70%/30%/25%/75% | 2 PLI | 4 PLI | 8 PLI | 8 PLI | SAME | 169.6 |
| EX-6 | BPDA/BTDA/RODA/HMD 50%/50%/25%/75% | 1.8 PLI | 1.8 PLI | 4.5 PLI | 6.8 PLI | SAME | 169.7 |
| EX-7 | BPDA/BTDA/RODA/HMD 30%/70%/25%/75% | NO ADHESION | 1.5 PLI | 5.7 PLI | 6.5 PLI | SAME | 168.1 |
| EX-8 | BPDA/BTDA/RODA/HMD 10%/90%/25%/75% | NO ADHESION | 1.5 PLI | 4 PLI | 6.3 PLI | SAME | 166.6 |
| EX-9 | BPDA/BTDA/RODA/HMD 0%/100%/25%/75% | NO ADHESION | 3.5 PLI | 4.5 PLI | 5.6 PLI | SAME | 160.2 |

Comparative Examples 1-7

The comparative examples below were preparing in accordance with the examples. The same components, processing conditions, and procedures were followed. However, the molar ratio of the components used was altered.

TABLE 2

| Comp Ex. No. | ADHESIVE COMPOSITION (MOLE %) | LAMINATION TEMP 180 C. PEEL STRENGTH | LAMINATION TEMP 190 C. PEEL STRENGTH | LAMINATION TEMP 200 C. PEEL STRENGTH | LAMINATION TEMP 250 C. PEEL STRENGTH | CURING | Tg |
|---|---|---|---|---|---|---|---|
| C-1 | BPDA/BTDA/RODA/HMD 90%/10%/100%/0% | NO ADHESION | NO ADHESION | NO ADHESION | NO ADHESION | 70 C.-150 1 HR 150-250 C. 1 HR. 330 C. 5 MIN. | 231.5 |
| C-2 | BPDA/BTDA/RODA/HMD 90%/10%/90%/10% | NO ADHESION | NO ADHESION | NO ADHESION | NO ADHESION | 70 C.-150 1 HR 150-250 C. 1 HR. 320 C. 5 MIN. | 203 |
| C-3 | BPDA/BTDA/RODA/HMD 90%/10%/75%/25% | NO ADHESION | NO ADHESION | NO ADHESION | 5.5 PLI | SAME | 206.9 |
| C-4 | BPDA/BTDA/RODA/HMD 90%/10%/65%/35% | NO ADHESION | NO ADHESION | NO ADHESION | 10.0 PLI | 70-150 C. 1 HR 150-250 C. 1 HR 300 C. 5 MIN. | 206.1 |
| C-5 | BPDA/BTDA/RODA/HMD 90%/10%/55%/45% | NO ADHESION | NO ADHESION | NO ADHESION | 11.0 PLI | 70-150-1 HR 150-250 C. 1 HR 320 C. 5 MIN. | 199.4 |
| C-6 | BPDA/BTDA/RODA/HMD 90%/10%/10%/90% | NO FILM BRITTLE OFF GLASS | NO FILM BRITTLE OFF GLASS | NO FILM BRITTLE OFF GLASS | NO FILM BRITTLE OFF GLASS | SAME | — |
| C-7 | BPDA/BTDA/RODA/HMD 90%/10%/0%/100% | NO FILM BRITTLE OFF GLASS | NO FILM BRITTLE OFF GLASS | NO FILM BRITTLE OFF GLASS | NO FILM BRITTLE OFF GLASS | SAME | — | d. the z-axis coefficient of thermal expansion of the polyimide base polymer, as determined by ASTM Method IPC-650 2.4.41, is between and including 80 and 150 ppm/° C., and e. the polyimide base polymer has a glass transition temperature from 150 to 200° C., and B. an inner layer, wherein the inner layer is a polyimide with a glass transition temperature greater than 250° C.

What is claimed is:

1. A multi-layer polyimide composite comprising:
    A. a first outer layer comprising a polyimide adhesive composition the polyimide adhesive composition comprising a polyimide base polymer synthesized by contacting an aromatic dianhydride with a diamine component, the diamine component comprising 50 to 90 mole % aliphatic diamine; and 10 to 50 mole % aromatic diamine,
    wherein:
    a. the aliphatic diamine is hexamethylene diamine (HMD),
    b. the aromatic diamine is 1,3-bis-(4-aminophenoxy) benzene,
    c. the aromatic dianhydride is a combination of 3,3',4,4'-benzophenone tetracarboxylic dianhydride (BTDA) and 3,3',4,4'-biphenyl tetracarboxylic dianhydride (BPDA), 2. A multilayer polyimide composite in accordance with claim 1, further comprising a first metal layer bonded to said first outer layer.

3. A multilayer polyimide composite in accordance with claim 2 further comprising a second metal layer wherein the second metal layer is bonded to a second polyimide adhesive outer layer.

4. A multilayer polyimide composite in accordance with claim 1, further comprising a second outer layer of said polyimide adhesive wherein the polyimide inner layer has a glass transition temperature greater than 250° C. and the polyimide inner layer is between the two outer layers of said polyimide adhesive.

5. A flexible polyimide metal-clad laminate having a polyimide adhesive layer and a metal layer, wherein the polyimide adhesive comprises a polyimide base polymer, the base polymer being synthesized by contacting an aromatic dianhydride component with a diamine component, wherein the diamine component is 50 to 90 mole % aliphatic diamine and 10 to 50 mole % aromatic diamine, the polyimide base polymer having a glass transition temperature from 150 to 200° C.

6. A flexible polyimide metal-clad laminate according to claim 5, wherein said metal layer is formed on said polyimide adhesive film by first sputtering end then electroplating a plurality of metal atoms onto a surface of said polyimnide adhesive.

7. A flexible polyimide metal-clad laminate according to claim 5, wherein said polyimide adhesive layer is cast onto said metal layer in a form of a polyamic acid and then dried and cured to form a polyimide.

8. A flexible polyimide metal-clad laminate according to claim 5, wherein a bond strength between the polyimide layer and the metal layer, as determined by ASTM Method IPC-TM-650 Method No. 2.4.9.D, is between and including 2 and 10 pounds per linear inch (pli).

9. The flexible polyimide metal-clad laminates of claim 5, wherein a lamination temperature of the polyimide adhesive layer to the metal layer is in the range of from 180° C. to 250° C.

* * * * *

UNITED STATES PATENT AND TRADEMARK OFFICE
CERTIFICATE OF CORRECTION

PATENT NO. : 7,348,064 B2
APPLICATION NO. : 11/282415
DATED : March 25, 2008
INVENTOR(S) : Kuppusamy Kanakarajan Page 1 of 1

It is certified that error appears in the above-identified patent and that said Letters Patent is hereby corrected as shown below:

In Column 17, Claim 6, Line 9, change "polyimnide" to read -- polyimide --.

Signed and Sealed this
Sixteenth Day of August, 2011

David J. Kappos
*Director of the United States Patent and Trademark Office*